(12) United States Patent
Wezelenburg et al.

(10) Patent No.: US 8,386,890 B2
(45) Date of Patent: Feb. 26, 2013

(54) ERROR CORRECTION FOR MULTILEVEL FLASH MEMORY

(75) Inventors: Martinus Cornelis Wezelenburg, Leuven-Kessel-Lo (BE); Thomas Kelshaw Conway, Cambridge (GB)

(73) Assignee: ARM Limited, Cambridge (GB)

( * ) Notice: Subject to any disclaimer, the term of this patent is extended or adjusted under 35 U.S.C. 154(b) by 706 days.

(21) Appl. No.: 12/585,353

(22) Filed: Sep. 11, 2009

(65) Prior Publication Data

US 2011/0066922 A1      Mar. 17, 2011

(51) Int. Cl.
G11C 29/42    (2006.01)
G11C 29/54    (2006.01)

(52) U.S. Cl. ........................ 714/773; 714/764
(58) Field of Classification Search .................. None
See application file for complete search history.

(56) References Cited

U.S. PATENT DOCUMENTS 6,151,246 A * 11/2000 So et al. ............... 365/185.09
7,791,938 B2 * 9/2010 Kang et al. ............ 365/185.03
8,136,014 B2 * 3/2012 Uchikawa et al. ............ 714/763
2008/0175063 A1 * 7/2008 Son et al. .................. 365/185.22
2009/0282308 A1 * 11/2009 Gutsche et al. ............... 714/746

OTHER PUBLICATIONS

Dan et al., "Implementing MLC NAND Flash for Cost-Effective, High-Capacity Memory", *M-Systems, Flash Disk Pioneers*, Sep. 2003, pp. 1-13.
Marvell, "PCI to NAND, SD and Camera Host Controller", Jul. 2007, pp. 1-160.

* cited by examiner

*Primary Examiner* — Ajay Bhatia
*Assistant Examiner* — Dipakkumar Gandhi
(74) *Attorney, Agent, or Firm* — Nixon & Vanderhye P.C.

(57) ABSTRACT

An integrated circuit is provided with an array of multilevel flash memory cells. In one embodiment these flash memory cells have a storage signal level which is Gray coded to output data bits thereby increasing the independence between bit errors. The error correction circuitry targets independent identical distributed error patterns. In another embodiment, the storage signal levels are read to generate n-bit symbols which are then subject to error correction with an error correction mechanism targeted at the error properties of those n-bit symbols. The data is read in sets of symbols such that the error correction targeted at those symbols will be more efficient.

8 Claims, 6 Drawing Sheets

ERROR CORRECTION FOR MULTILEVEL FLASH MEMORY

TECHNICAL FIELD

The technical field is data processing systems, and the technology described below relates to error correction of data read from multilevel flash memory.

BACKGROUND

It is known to provide flash memory, such as NAND flash memory and NOR flash memory, to provide non-volatile data storage. The data storage capacity and access speeds of such flash memories have steadily increased with improvements in this technology. However, there are several sources of error inherent with such memories that can cause stored data to be lost or corrupted.

Figure 1:
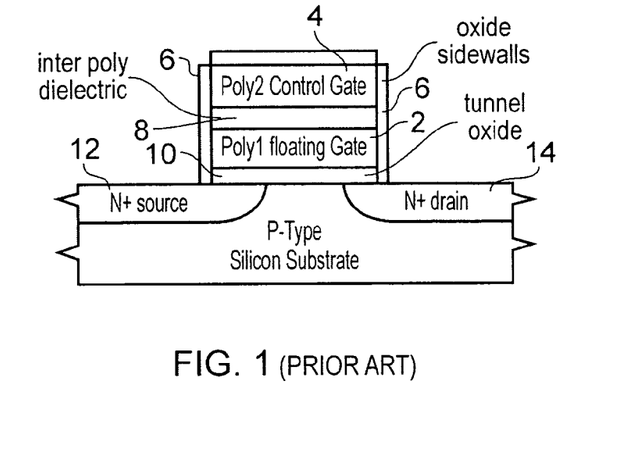
FIG. 1 schematically illustrates a flash memory cell.

FIG. 1 of the accompanying drawings illustrates a NAND flash memory cell.

Charge is injected into a floating gate 2 under action of a control gate 4. Charge injected into the floating gate 2 remains held there as it is surrounded by oxide sidewalls 6, inter poly dielectric 8 and tunnel oxide 10. The floating gate 2 thus is held at a potential which varies in dependence upon the amount of charge injected into the floating gate 2. When the memory cell is read, the charge on the floating gate 2 influences the amount of current which flows between a source 12 and a drain 14 in a manner similar to that of a standard field effect transistor.

There are several error mechanisms which can occur and prevent the proper storage or reading of data to or from the cell of FIG. 1. These include cell charge loss, read disturb errors, program disturb errors and wear damage errors. Cell charge loss errors are caused by a change in the charge levels stored within the floating gate 2 due to charge leakage. These errors can be mitigated by refresh read-write cycles, such as those which are implicit in a wear levelling mechanism as will be familiar to those in this technical field. The read disturb and program disturb errors are connected to the configuration and operation of the NAND memory cell. The memories cells are not independent. The memory cells are typically arranged in a string on a bit line. A consequence of this is that access to a cell takes place through other cells. Furthermore, access for either read or write requires applying voltages which are typically significantly higher than the storage voltage levels in intervening cells. Read disturb errors are typically caused by charge migration due to application of the read voltage to the selected cell. Various forms of program disturb errors are caused by charge migration due to application of the program voltage to the selected cell. Finally, repeated application of the relatively high read and program voltages can result in the cell oxide layers becoming damaged such that the cell no longer retains charge as this leaks away.

Flash memory cells as originally produced provided two voltage levels storing one bit of data and corresponding to the floating gate being either charged or uncharged. Recent advances within the field have lead to the introduction of multilevel flash memory cells having more than two voltage levels, e.g. $2^n$ voltage levels capable of storing a charge representing n-bits of data. This type of cell is termed a multilevel cell (MLC) and their introduction has resulted in an increase in storage density.

Figure 2:
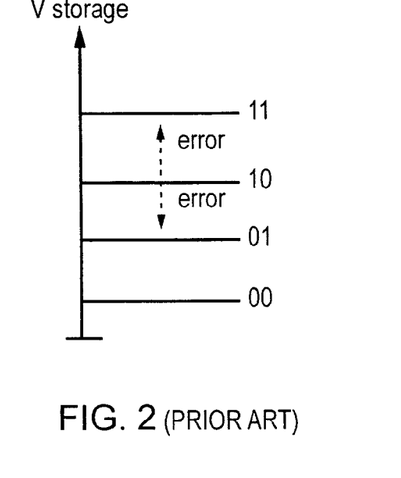
FIG. 2 schematically illustrates a flash memory cell having four storage signal levels.

FIG. 2 of the accompanying drawings schematically illustrates the voltage levels which may be stored by an MLC having four voltage levels and thus capable of representing two bits of data. As illustrated, the different increasing voltage levels are used to represent a monotonically increasing two bit number. A storage or read error can occur when the voltage is sensed, with the result that the voltage level is incorrectly sensed as corresponding to one of the adjacent voltage levels. It is also possible that other errors may occur, such as the complete discharge of the MLC or other errors resulting in the read value being other than the adjacent value.

Figure 3:
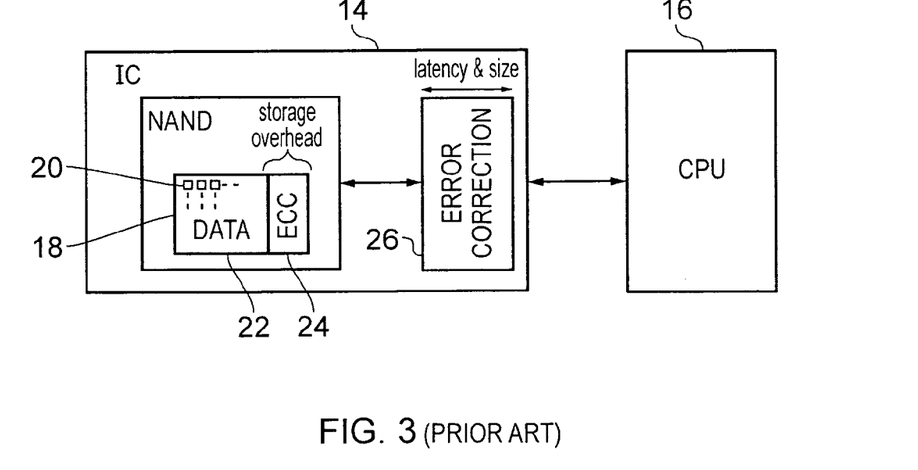
FIG. 3 schematically illustrates a system using a flash memory and an error correction mechanism.

In order to address these errors within flash cells, it is known to provide error correction mechanisms within the read path. FIG. 3 of the accompanying drawings illustrates such an arrangement. In the system of FIG. 3 an integrated circuit flash memory 14 is coupled to a processor 16. The processor 16 can store data values into the flash memory 14 and read data values from the flash memory 14. The flash memory 14 contains an array 18 of flash memory cells 20. This array 18 includes a portion 22 storing the data values written by the processor 16 as well as the portion 24 storing error correction codes. The error correction code (ECC) codewords are written by error correcting circuitry 26 disposed in the data path between the processor 16 and the array 18. The error correction code is typically a systematic code where the codewords are the original data, with parity data added into the stored data when it is written and are used when the stored data is read so as to detect any errors within that stored data and correct any detected errors if they are within the capability for correction by the error correcting codes (e.g. the errors are not too extensive). Such mechanisms are able to reduce the statistical likelihood of a read error as would be observed by the data sink in processor 16, interfacing with the ECC protected NAND 14, to acceptable levels, even though many individual flash cells may be defective.

A problem with the system of FIG. 3 is that the storage requirement for the error correcting codes within the portion 24 represents a disadvantageous storage overhead which reduces the overall capacity of the array 18 for storing useful data. Measures which can reduce the amount of error correcting codes which need to be stored in order to provide appropriate error correction are advantageous as they will release storage capacity within the array 18 for use in storing the working data to be written and read by the processor 16. Another problem with the system of FIG. 3 is that the error correction mechanism 26 introduces a disadvantageous latency into the reading and writing operations from the array 16 which reduces the system performance. Furthermore, the error correction mechanism 16 can be relatively large and complex thereby disadvantageously increasing the size, cost and access speed of the system. It will be appreciated that measures which can reduce the overhead associated with the error correction requirements of the flash memory cells whilst maintaining data integrity are advantageous.

SUMMARY

Viewed from one aspect, an integrated circuit comprises:
an array of multilevel flash memory cells, each cell having $2^n$ signal storage levels corresponding to an n-bit symbol, where n is an integer greater than one;
error correcting circuitry coupled to said array and configured to perform error correction upon a set of said n-bit symbols; wherein
said error correcting circuitry performs error correction matched to symbol error properties of said n-bit symbols, said symbol error properties being determined by one or more physical properties of said cells.

When a multilevel flash memory cell is being used having $2^n$ signal storage levels corresponding to an n-bit symbol, where n is an integer greater than one, the error correcting circuitry being used can be increased in efficiency and/or effectiveness if the signal storage levels read from the memory cell are treated as n-bit symbols with the error correction matched to the symbol error properties of the n-bit symbols. In contrast, in the known systems the errors in the read data are treated as independent errors without any regard to matching the error correction mechanisms to the symbol error properties, which in turn are controlled by the physical properties of the cell. By matching the error correction mechanisms to the symbol error properties, the error correction mechanisms can better correct errors that are statistically likely to occur without providing redundant capacity to correcting errors which are unlikely to occur. As a result, it is possible to reduce the amount of error correction code parity data overhead which needs be stored to achieve the same degree of error protection and/or reduce the hardware overhead associated with the error correcting mechanism, in terms of size and/or latency.

It is convenient to form the error correction circuitry to process n-bit symbols read from the array in sets of m of these n-bit symbols, where m is an integer greater than one. By correcting the errors by operating upon data containing an integer number of the n-bit symbols read from the multilevel flash cells, a higher degree of error correction efficiency may be achieved.

The n-bit symbols may be conveniently read from the array as a frame containing k sets, each set comprising m of the n-bit symbols and where k is less than $2^{n*m}$ since m*n defines the address space with a frame. The frame contains both the parity symbols and the data symbols (and thus it is possible that when the parity data is included then the frame size may exceed $2^{n*m}$, but the sets of symbols will still be addressable with the frame).

The error correction performed upon the sets of m of the n-bit symbols may advantageously be Reed Solomon (RS) algebraic error correction as the word size then matches an integer number of symbols in a manner which increases the efficiency of the error correction.

The flash memory cells may be NAND flash memory cells or NOR flash memory cells depending upon the particular technology of the flash memory.

Viewed from a further aspect, an integrated circuit comprises:

an array of multilevel flash memory cell means, each cell means having $2^n$ signal storage levels corresponding to an n-bit symbol, where n is an integer greater than one;

error correcting means coupled to said array for performing error correction upon a set of said n-bit symbols; wherein said error correcting means performs error correction matched to symbol error properties of said n-bit symbols, said symbol error properties being determined by one or more physical properties of said cell means.

Viewed from a further aspect, a method of accessing data within an integrated circuit comprises the steps of:

storing data within an array of multilevel flash memory cells, each cell having $2^n$ signal storage levels corresponding to an n-bit symbol, where n is an integer greater than one;

reading a set of n-bit symbols from said array;

performing error correction upon said set; wherein said error correction is matched to symbol error properties of said n-bit symbols, said symbol error properties being determined by one or more physical properties of said cell.

Viewed from another aspect, an integrated circuit comprises:

an array of multilevel flash memory cells, each cell having $2^n$ signal storage levels, where n is an integer greater than one;

precoding circuitry coupled to said array and configured to read a signal from a cell being accessed and to generate n bits of data representing said signal;

error correcting circuitry coupled to said precoding circuitry and configured to perform error correction upon said n bits of data read from said precoding circuitry; wherein said precoding circuitry maps said signal from said cell to said n bits of data with a mapping that increases independence between bit errors in said n bits of data; and said error correction performed by said error correcting circuitry is targeted at independent identical distributed error patterns.

The physical properties of a multilevel flash memory cell, each cell having $2^n$ signal storage levels, where n is an integer greater than one, in which the errors associated with the different storage levels may be such that a simple monotonic mapping of signal storage level to bit value as illustrated in FIG. 2 results in some bit errors being highly likely and some bit errors being highly unlikely inefficiently uses the error correcting capability and resources which are provided. The technique described recognises and addresses this issue by providing a precoding circuitry coupled to the array which reads the signal from the storage cell and generates the n-bits of data representing that signal using a mapping that increases independence between bit errors in the n-bits of data which are generated. This increased independence in the bit errors compared with a monotonic relationship between signal storage level and n-bit data value has the result that the error correction performed by the error correcting circuitry may be targeted at independent identical distributed error patterns without a loss of efficiency.

The mapping employed by the precoding circuitry may be Gray coding of the signal to the n-bits of data.

The value of n can vary, but is preferably one of 2, 3 and 4.

The form of error correction used may also vary, but the present technique is well suited to algebraic error correction, such as binary Bose Ray-Chaudhuri Hocquenghem (BCH) error correction coding.

The flash memory cell may be a NAND flash memory cell, or a NOR flash memory cell depending upon implementation.

Viewed from a further aspect, an integrated circuit comprises:

an array of multilevel flash memory cell means, each cell means having $2^n$ signal storage levels, where n is an integer greater than one;

precoding means coupled to said array for reading a signal from a cell means being accessed and generating n bits of data representing said signal;

error correcting means coupled to said precoding means for performing error correction upon said n bits of data read from said precoding means; wherein said precoding means maps said signal from said cell means to said n bits of data with a mapping that increases independence between bit errors in said n bits of data; and said error correction performed by said error correcting means is targeted at independent identical distributed error patterns.

Viewed from a further aspect, a method of accessing data within an integrated circuit comprises the steps of:

storing data within an array of multilevel flash memory cells, each cell having $2^n$ signal storage levels corresponding to an n-bit symbol, where n is an integer greater than one;

reading a signal from a cell being accessed mapping said signal to n bits of data with a mapping that increases independence between bit errors in said n bits of data; and performing error correction upon said n bits of data; wherein said error correction performed is targeted at independent identical distributed error patterns.

The above, and other objects, features and advantages will be apparent from the following detailed description of illustrative, non-limiting embodiments which is to be read in connection with the accompanying drawings.

DESCRIPTION OF NON-LIMITING EXAMPLE EMBODIMENTS

Figure 4:
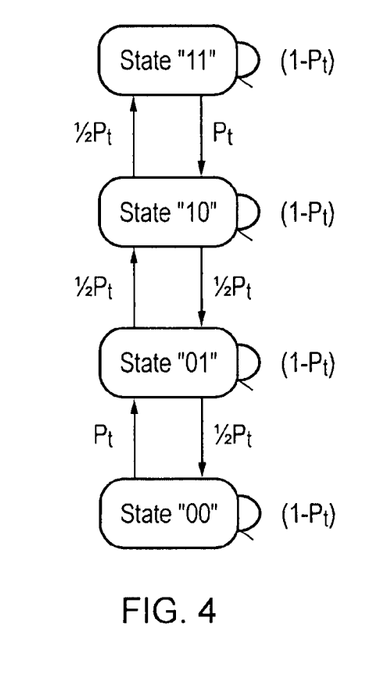
FIG. 4 illustrates a multilevel flash NAND memory cell error model based on a uniform state retention probability.

FIG. 4 illustrates a multilevel NAND flash memory cell error model based upon a uniform state retention probability for a 2-bit memory cell using a mapping between signal storage level and data value as illustrated in FIG. 2. This mapping between signal storage level and data value shows a monotonic (in this case increasing with stored charge) relationship following the natural order {00,01,10,11}. With this ordering, a change from one level to a next level may in some cases cause errors in two bits, e.g. a change from 01 to 10. For charge loss and charge migration errors, the most likely error to occur is a change of one level. The bit-error probability $P_e$ may be obtained from the transition probability $P_t$. For the 4-level NAND cell of this example, there are six possible level transitions as illustrated in FIG. 4. If it is assumed that the transition probability is uniform, i.e. equally likely to change up a level or down a level, then the error model of FIG. 4 applies. It will be appreciated that this error model is only an approximation since the assumption that transitions up and down are equally likely is, in practice, not valid since cell charge loss errors are only likely to moving to lower levels. Nevertheless, it will be seen from the error model of FIG. 4 that the low order bit is more likely to be subject to an error than the high order bit. This is a result of the physical properties of the memory cell and how these relate to the 2-bit symbol read from the memory cell to represent the data.

Figure 5:
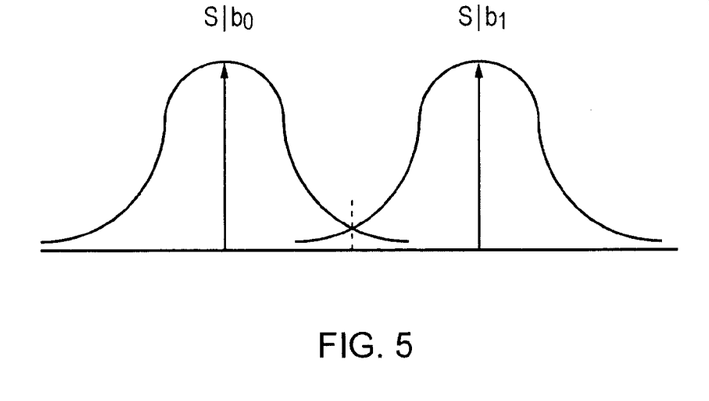
FIG. 5 schematically illustrates the cross-over probability of errors due to noise with a Gaussian distribution.
Figure 6:
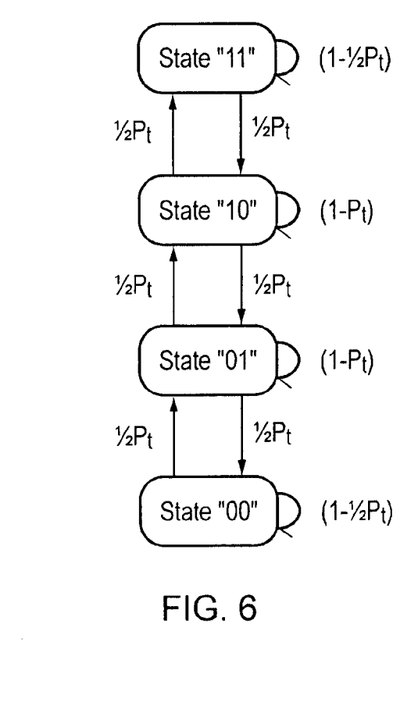
FIG. 6 schematically illustrates a multilevel NAND flash memory cell error model based upon a non-uniform cross-over probability.

FIG. 5 schematically illustrates the cross-over probability of a bit read due to Gaussian noise in accordance with a standard error model for data transmission. The information bit b can have two states, namely $b_0$ and $b_1$, mapped on to different signal storage levels. The received symbol after reading takes the value defined by either level and the additive noise. The noise is typically Gaussian. In this scenario, the preferred decision threshold is the mid-point between the two levels. The bit error probability is the sum of the probability of deciding on $b_0$, when the stored signal value is in fact $b_1$, and deciding on $b_1$, when the stored signal value is $b_0$. This corresponds to the integral under the tail of the Gaussian probability density function. It should be noted that this cross-over should only be counted in one direction. With more levels, the inner levels can cross over in two directions and in fact, cross multiple levels (but with very low probability). In a context of a model of FIG. 1 using the transition probability $P_t$, the multilevel error model becomes as depicted in FIG. 6, with a difference in the transition error between the inner and outer levels. It will be appreciated that this error model is only an approximation, but that the approximation can be improved by defining for each individual storage level in FIG. 5 a better matching Probability Density Function (PDF)

Figure 7:
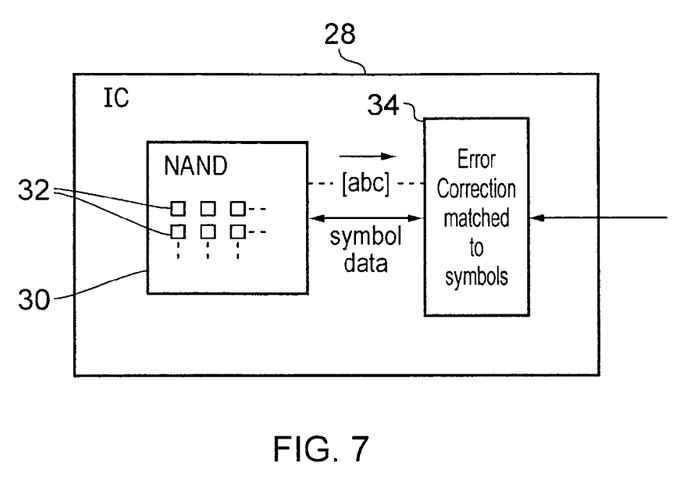
FIG. 7 schematically illustrates an integrated circuit having error correction mechanisms matched to symbol error properties of n-bit symbols read from a flash memory array.

FIG. 7 illustrates an integrated circuit 28 including an array 30 of multilevel flash memory cells 32. Each of these flash memory cells stores a charge corresponding to one of $2^n$ signal storage levels and corresponding to an n-bit symbol when read, where n is an integer greater than one. In more specific example embodiments n can be 2, 3 or 4. These values of n yield cells having respectively 4, 8 and 16 signal storage levels.

The array 30 stores both data values and error correction codes. These error correction codes are Reed Solomon codes.

Error correction circuitry 34 is coupled to the array 30 and serves to read and write data values to the flash memory cells 32 within the array 30. As the memory cells 32 are multilevel memory cells as previously discussed, the data cells are written and read using n-bit symbols, where n is greater than one. The example illustrated in FIG. 7 shows a 3-bit symbol [abc] being read from the array 30.

As previously discussed in relation to FIGS. 4, 5 and 6, the physical properties of the memory cells 32 result in symbol error properties of the n-bit symbols which are non-uniform between different bit values within the n-bit symbols. As an example, certain of the bits of the symbols may be more prone to the errors than other of the bits. The error correction circuitry 34 is configured and operated to match the symbols using which the array 30 is accessed and their error properties. The error correcting circuitry forms error correction upon sets of these symbols. The probability of an error in an n-bit symbol is lower than the bit-error probability of bits forming the n-bit symbol.

Figure 8:
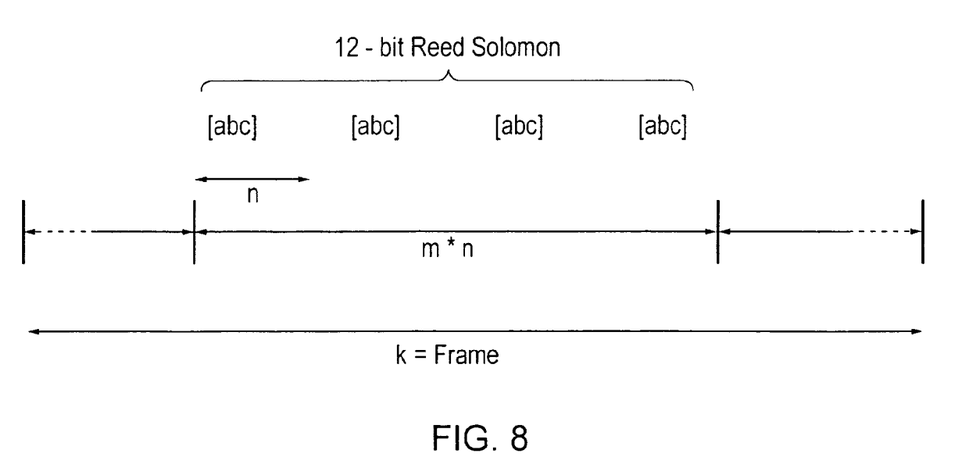
FIG. 8 schematically illustrates a frame of memory cells comprising a plurality of sets of symbols, each set having m symbols and each symbol being an n-bit symbol.

As illustrated in FIG. 8, a set of symbols comprises m of the n-bit symbols. As shown, this corresponds to four 3-bit symbols resulting in a 12-bit word. This 12-bit word is subject to 12-bit Reed Solomon error correction using error correcting codes that are also stored within the array 30. The sets of symbols are read from the array 30 in frames with each frame containing k of the sets, each set containing m of the n-bit symbols.

The use of Reed Solomon (symbol based) codes serves to reduce the size and cost of the error correction circuitry since the address space within which errors are located is reduced making the bit width of the circuitry narrower and the search speed within this address space quicker. Although Reed Solomon codes require the computation of the error value when an erroneous symbol is detected, this computation incurs only a linear cost as opposed to the cost of a larger search space.

The memory cells 32 are, in this example, NAND memory cells. It is also possible that NOR flash memory cells may be used.

Figure 9:
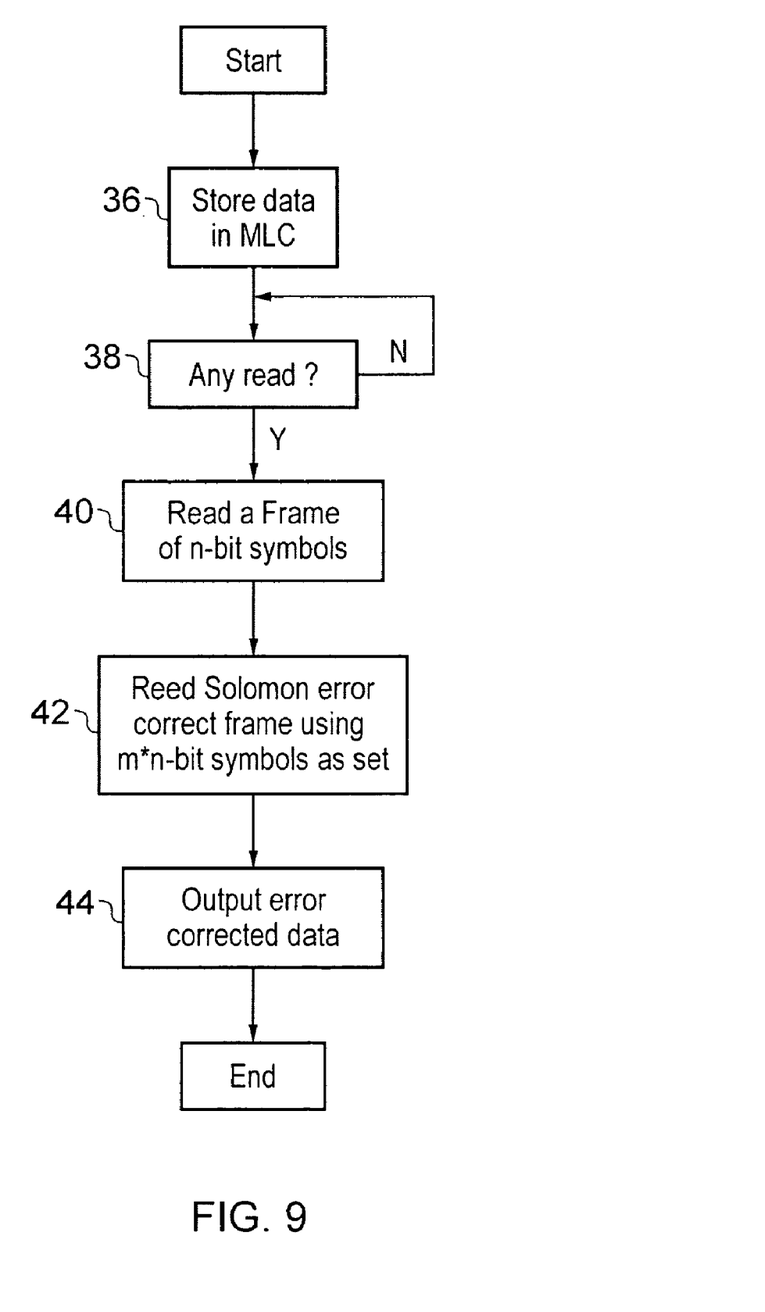
FIG. 9 is a flow diagram schematically illustrating the operation of the system of FIG. 7.

FIG. 9 is a flow diagram schematically illustrating the operation of the system of FIG. 7. At step 36, data is stored into the multilevel flash memory cells 32. At step 38, the processing waits until a read request is made. When a read request is made, step 40 reads a frame of n-bit symbols. These n-bit symbols are grouped into sets, such as sets each containing m of the n-bit symbols. These sets of symbols are then subject to Reed Solomon error correction at step 42. The output data subject to any error correction made is then output to the processor, or other device, at step 44.

Figure 10:
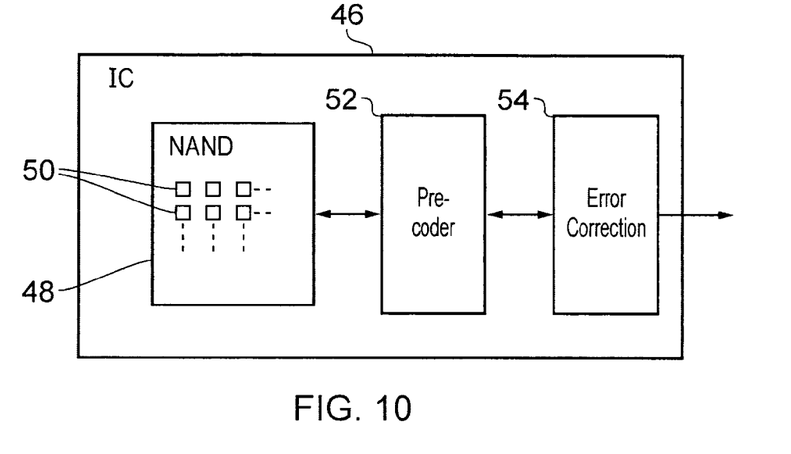
FIG. 10 is a diagram schematically illustrating an integrated circuit including a flash memory array and precoding circuitry for applying a mapping that increases independence between bit errors within the n-bits of data read from a multilevel flash memory cell.

FIG. 10 illustrates another integrated circuit 46. The integrated circuit 46 contains an array 48 of memory cells 50. A pre-coding circuit 52 is coupled to the array 48 and serves to read and write to the memory cells 50 (which may be NAND or NOR MLCs). Error correction circuitry 54 receives n-bits of data from the precoder 52 for each memory cell 50 which is read.

Figure 11:
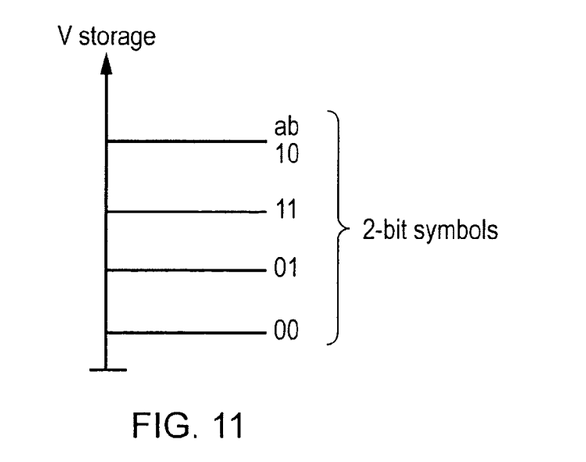
FIG. 11 schematically illustrates Gray coding applied to the multiple signal storage levels within a flash memory cell.

FIG. 11 illustrates the relationship between the signal storage levels of the memory cells 50 and the data values these represent as mapped by the pre-coding circuitry 52. In particular, the pre-coding circuitry 52 maps the storage signal levels in ascending voltage (charge) order to the 2-bit data values 00, 01, 11 and 10. This is a Gray coding. It will be appreciated that this is only one example of a Gray coding which may be used and other mappings are possible.

The mapping performed by the precoding circuitry 52 serves to increase the independence between bit errors in the bits of data read from a memory cell 50. In particular, in this example the mapping applied has the result that the bit errors produced more closely resemble independent identical distributed error patterns. Accordingly, the error correction circuitry 54 is targeted at such independent identical distributed error patterns in the error correction it performs. One example of the error correction performed targeted at such error is Bose and Ray-Chaudhuri Hocquenghem (BCH) codes. Such BCH codes are well suited to error correction of independent identical distributed error patterns, but are less well suited to the type of non-uniform symbol error properties that are associated with the memory cells when accessed in accordance with FIG. 2 and FIGS. 4, 5 and 6. The action of the pre-coding circuitry 52 is to map the storage signal levels in which they more closely correspond to independent identical distributed error patterns such that the error correction mechanisms can efficiently deal with these error patterns.

Figure 12:
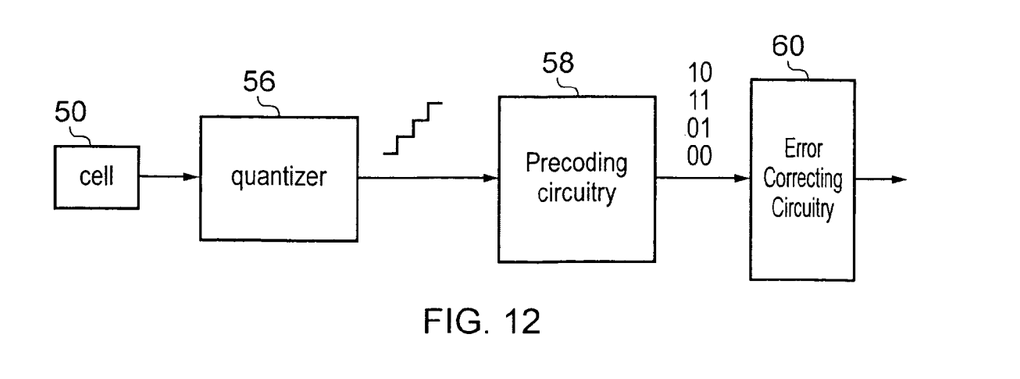
FIG. 12 schematically illustrates the data path of signal processing applied between a flash memory cell and output from the error correcting circuitry.

FIG. 12 schematically illustrates the signal path upon reading a flash memory cell 50. A quantizer circuit 56 serves to read the storage signal level from the cell 50 and produced a quantized output at a distinct pre-defined voltage level. The pre-coding circuitry 58 reads this quantized signal and Gray codes this to a 2-bit output corresponding to two bits of data. These data bits are then passed to error correcting circuitry 60, where they are subject to BCH error correction.

Figure 13:
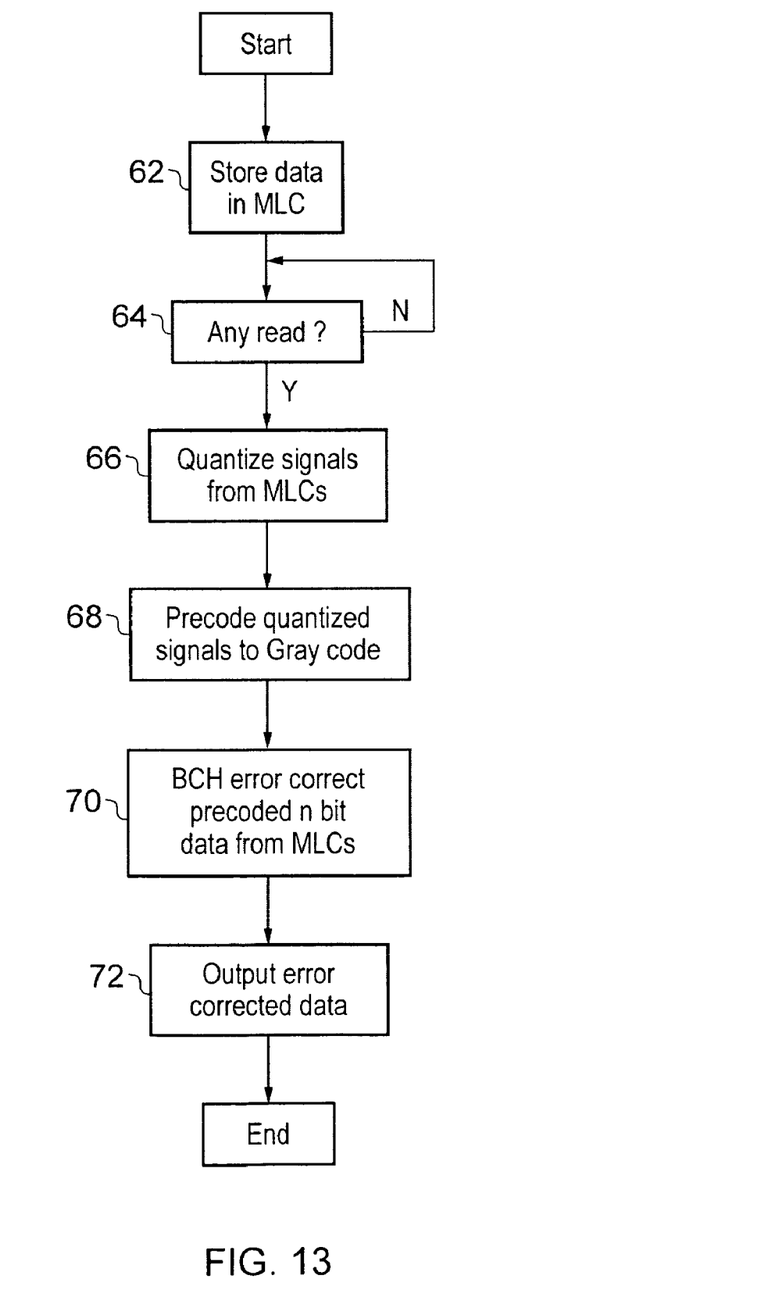
FIG. 13 is a flow diagram schematically illustrating the operation of the system of FIG. 10.

FIG. 13 is a flow diagram illustrating the operation of the system of FIG. 10. At step 62 data values comprising multi-bit data values are stored into the flash memory cells. At step 64 the system waits for a read to be requested. At step 66 the storage signal value is read from the memory cell concerned and quantized to one of a pre-determined number of levels. At step 68 the precoding circuitry precodes the quantized signals to form a Gray code. At step 70 the error correction circuitry performs BCH error correction on the precoded data from the precoding circuitry. At step 72 the read data, subject to error correction as necessary, is output from the integrated circuit.

Although illustrative non-limiting, example embodiments have been described in detail herein with reference to the accompanying drawings, it is to be understood that the claims are not limited to those precise embodiments, and that various changes and modifications can be effected therein by one skilled in the art without departing from the scope and spirit of the claims.

We claim:

1. An integrated circuit comprising:
an array of multilevel flash memory cells, each cell having $2^n$ signal storage levels corresponding to an n-bit symbol, where n is an integer greater than one;
error correcting circuitry coupled to said array and configured to perform error correction upon a set of said n-bit symbols; wherein
said error correcting circuitry performs error correction matched to symbol error properties of said n-bit symbols, said symbol error properties being determined by one or more physical properties of said cells.

2. An integrated circuit as claimed in claim 1, wherein a probability of an error in said n-bit symbol is lower than a bit-error probability of bits forming said n-bit symbol.

3. An integrated circuit as claimed in claim 1, wherein said error correction circuitry processes n-bit symbols read from said array in sets of m of said n-bit symbols, where m is an integer greater than one.

4. An integrated circuit as claimed in claim 3, wherein said error correction circuitry processes said sets of m of said n-bit symbols as frames of data formed of k of said sets of m of said n-bit symbols, where k is less than $2^{n*m}$.

5. An integrated circuit said claimed in claim 3, wherein said error correction circuitry performs Reed Solomon code error correction upon each of said sets.

6. An integrated circuit as claimed in claim 1, wherein said cell is one of:
a NAND flash memory cell; and
a NOR flash memory cell.

7. An integrated circuit comprising:
an array of multilevel flash memory cell means, each cell means having $2^n$ signal storage levels corresponding to an n-bit symbol, where n is an integer greater than one;
error correcting means coupled to said array for performing error correction upon a set of said n-bit symbols; wherein
said error correcting means performs error correction matched to symbol error properties of said n-bit symbols, said symbol error properties being determined by one or more physical properties of said cell means.

8. A method of accessing data within an integrated circuit, said method comprising the steps of:
storing data within an array of multilevel flash memory cells, each cell having $2^n$ signal storage levels corresponding to an n-bit symbol, where n is an integer greater than one;
reading a set of n-bit symbols from said array;
performing error correction upon said set; wherein
said error correction is matched to symbol error properties of said n-bit symbols, said symbol error properties being determined by one or more physical properties of said cell.

* * * * *